(12) United States Patent
Halimaoui et al.

(10) Patent No.: US 7,279,404 B2
(45) Date of Patent: Oct. 9, 2007

(54) PROCESS FOR FABRICATING STRAINED LAYERS OF SILICON OR OF A SILICON/GERMANIUM ALLOY

(75) Inventors: Aomar Halimaoui, La Terrasse (FR); Daniel Bensahel, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 184 days.

(21) Appl. No.: 10/882,995

(22) Filed: Jul. 1, 2004

(65) Prior Publication Data

US 2005/0037599 A1 Feb. 17, 2005

(30) Foreign Application Priority Data

Jul. 1, 2003 (FR) .................. 03 07982

(51) Int. Cl.
*H01L 21/20* (2006.01)

(52) U.S. Cl. .................. 438/478; 438/960; 257/75; 257/E21.215

(58) Field of Classification Search ........... 438/938, 438/481
See application file for complete search history.

(56) References Cited

U.S. PATENT DOCUMENTS

| | | | |
|---|---|---|---|
| 5,466,631 A | 11/1995 | Ichikawa et al. | |
| 6,376,859 B1 | 4/2002 | Swanson et al. | |
| 6,603,156 B2 * | 8/2003 | Rim | 257/190 |
| 6,677,192 B1 * | 1/2004 | Fitzgerald | 438/172 |
| 6,709,903 B2 * | 3/2004 | Christiansen et al. | 438/149 |
| 6,812,116 B2 * | 11/2004 | Huang et al. | 438/464 |
| 7,018,910 B2 * | 3/2006 | Ghyselen et al. | 438/458 |
| 2002/0016067 A1 * | 2/2002 | Yamagata et al. | 438/689 |
| 2003/0119280 A1 * | 6/2003 | Lee et al. | 438/459 |
| 2004/0053477 A1 * | 3/2004 | Ghyselen et al. | 438/465 |

FOREIGN PATENT DOCUMENTS

| EP | 0793263 A2 | 9/1997 |
|---|---|---|
| FR | 2 839 505 | 11/2003 |

OTHER PUBLICATIONS

Nesbit, L.A., "Defect-Free Silicon on Insulator by Oxidized Porous Silicon," IBM Technical Disclosure Bulletin, IBM Corp., New York, XP000806368, ISSN: 0018-8689, vol. 27, No. 8, pp. 4632-4633, Jan. 1985.

Wierzchowski, W., et al., "Investgation of Lattice Strains in Layered Structures Containing Porous Silicon," ACTA Physica Polonica A, Poland, XP008029247, pp. 283-288, Aug. 2002.

Preliminary Search Report for French Application No. 0307982 dated Mar. 29, 2004.

* cited by examiner

*Primary Examiner*—Jerome Jackson
*Assistant Examiner*—Paul Budd
(74) *Attorney, Agent, or Firm*—Lisa K. Jorgenson; Jose Gutman; Fleit Kain Gibbons Gutman Bongini & Bianco P.L.

(57) ABSTRACT

A process for fabricating a strained layer of silicon or of a silicon/germanium alloy, includes:

a) the formation of a layer (2) of silicon or of a silicon/germanium alloy on a layer (1) of a material having a modifiable lattice parameter; and b) the modification of the lattice parameter.

8 Claims, 2 Drawing Sheets

PROCESS FOR FABRICATING STRAINED LAYERS OF SILICON OR OF A SILICON/GERMANIUM ALLOY

CROSS REFERENCE TO RELATED APPLICATION

This application is based upon and claims priority from prior French Patent Application No. 03 07982, filed on Jul. 1, 2003, the entire disclosure of which is herein incorporated by reference.

BACKGROUND OF THE INVENTION

1. Field of the Invention

The invention generally relates to integrated circuits and more particularly to the fabrication of strained layers of silicon (Si) or of a silicon/germanium (SiGe) alloy, the said integrated circuits generally being used in the fabrication of transistors.

2. Description of the Related Art

The application of a tensile stress to a silicon film results in a considerable increase in the mobility of the carriers.

The techniques currently employed for fabricating strained Si films are entirely based on the epitaxy of silicon or of a silicon/germanium alloy. The first silicon/germanium layer obtained by epitaxy on a bulk silicon substrate is in compression. However, as soon as this first layer exceeds a certain thickness (depending on the germanium concentration and on the deposition temperature), there is strain relief and the silicon/germanium film resumes its "bulk" lattice parameter. The latter is generally called a "relaxed substrate". Since this lattice parameter is higher than that of silicon, the epitaxial growth of an Si film on this relaxed silicon/germanium layer is again in tension.

Fabrication of transistors on this type of strained silicon film has clearly demonstrated the increase in the performance of the devices thanks to better carrier mobility. However, the fabrication of relaxed silicon/germanium substrates of high crystallographic quality remains a complex process. This is because relaxing the strain in the silicon/germanium film is manifested by the formation of a high dislocation density, which may make the material unusable.

By growing silicon/germanium films having a germanium gradient, the formation of an emergent dislocation at the surface may be avoided. However, in order to be relaxed, the silicon/germanium layer must have a thickness of greater than 1 μm (depending on the germanium concentration). This results in very lengthy deposition times that are therefore incompatible with industrial use.

In addition, after the deposition phase, the silicon/germanium layer requires a chemical-mechanical polishing step and therefore a cleaning step, which makes the process expensive.

Accordingly, there exists a need for overcoming the disadvantages of the prior art as discussed above.

SUMMARY OF THE INVENTION

The aim of the invention is to provide a solution to these problems.

The present invention therefore proposes a process for fabricating a strained layer of silicon or of a silicon/germanium alloy, comprising:

a) the formation of a layer of silicon or of a silicon/germanium alloy on a layer of a material having a modifiable lattice parameter; and b) the modification of the lattice parameter.

The material with a modifiable lattice parameter is advantageously porous silicon. This is because porous silicon is capable of having its lattice parameter varied continuously around the value that it possesses in bulk silicon. This property may be exploited so as to grow, on top of the porous silicon, layers in epitaxial relationship. In the case of heteroepitaxial growth, the thickness of the strained layers may even reach a "limiting thickness", at which thickness dislocations that relax the built-up strain appear.

The process according to the invention therefore makes it possible to modify at will, for example by a simple heat treatment in a controlled atmosphere, or by filling the pores of the subjacent layers, the value of the lattice parameter of the porous material (the strain value of the porous layer) and therefore to modify the tensile (or relaxation) state of the epitaxially grown silicon or silicon/germanium upper layer. This is because it is in and on this upper layer that the transistors will be fabricated, the strained state of the channel of which may be modified.

The upper layer of material having a modifiable lattice parameter, for example porous silicon, may be formed before or after the layer of silicon or silicon/germanium intended to be strained is formed.

The strained state of the porous silicon layer may be modified by a heat treatment, for example of between 200 and 700° C.

The strained state of the porous silicon may also be modified by molecular grafting using groups such as, for example, methyl groups.

BRIEF DESCRIPTION OF THE DRAWINGS

Other advantages and features of the invention will become apparent on examining the detailed description of embodiments and methods of implementation, which are in no way limiting, and the appended drawings in which.

DETAILED DESCRIPTION

Figure 1D:
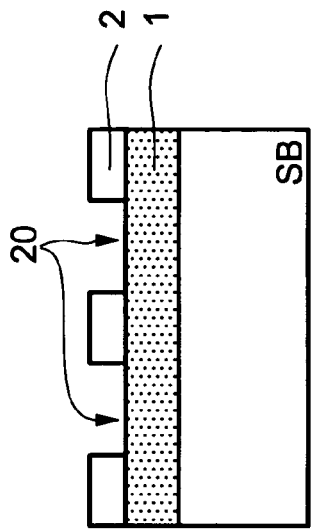
FIGS. 1a to 1f diagrammatically illustrate the main steps of a first method of implementing the invention.
Figure 1E:
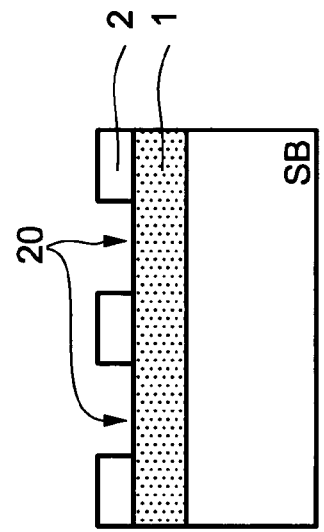
Figure 1F:
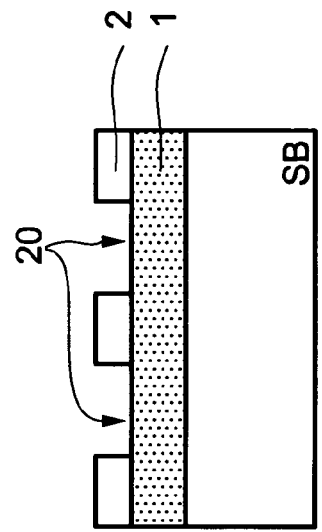
Figure 1A:
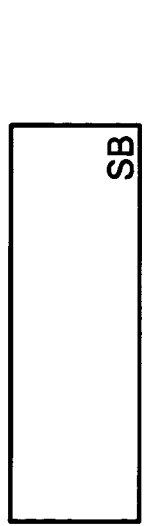

In FIG. 1a, the reference SB denotes a semiconductor substrate, for example made of silicon or of silicon/germanium, and possibly containing carbon C if necessary.

Figure 1B:
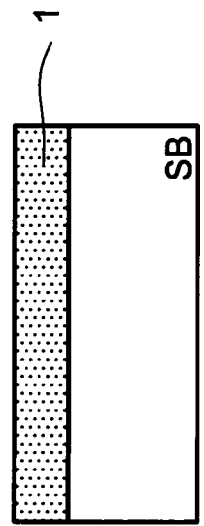

The first step of the process is the formation of a layer 1 of porous silicon on the substrate (FIG. 1b). Porous silicon is a single-crystal material having a highly developed surface, with an area of up to 1000 m2 per cm3 of material, and is obtained in a manner known per se electrochemically, for example in a hydrofluoric acid medium.

After the layer 1 has been formed, the entire surface of the porous silicon is saturated with hydrogen (SiH bonds) and this presence of hydrogen strains the porous silicon layer. The amount of hydrogen may be modified in several ways so as to make the layer pass from a compressive state to a tensile state.

Thus, the strained state of the porous silicon layer 1 may be modified by treating the said layer with hydrofluoric acid.

It is also possible to modify the strained state and the developed surface area of the material by varying the porosity of the material and/or the type of substrate (p, p+, n or n+).

For a given type of substrate, the amount of hydrogen may be modified by heat treatment within a temperature range of between 200 and 700° C. The temperature is limited to around 700° C. so as to prevent the porous silicon from being transformed by pore coalescence.

During this heat treatment, hydrogen is desorbed and therefore the strain is modified. For example, after formation the porous silicon has a larger lattice parameter than bulk silicon. Above 200° C., there is hydrogen desorption and the lattice parameter decreases until reaching that of bulk silicon at around 400° C., and continues to decrease at higher temperatures.

This change in the strained state is reversible. This is because, after heat treatment, the porous silicon need only be brought into contact with hydrofluoric acid in order for it to resume its initial state, before any heat treatment. It is therefore apparent that, by simple heat treatment of the porous silicon the desired strain in the silicon layer may be obtained by adjusting the lattice parameter values.

Figure 1C:
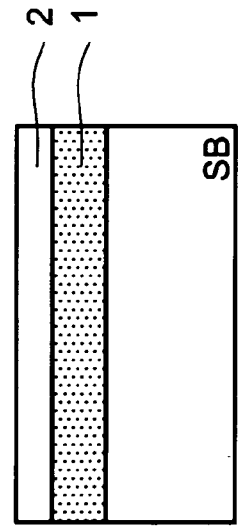

The next step of the process (FIG. 1c) comprises the growth, by an epitaxial operation known per se, of a layer 2 of silicon or of a silicon/germanium alloy.

To gain access to the porous silicon layer 1, in order to modify its lattice parameter by various possible treatments, apertures 20 are etched in the layer 2 (FIG. 1d), for example by chemical etching.

The wafer is then immersed in a hydrofluoric acid solution (FIG. 1e). The purpose of this treatment is to restore the hydrogen coverage lost during the epitaxial phase.

After this hydrofluoric acid treatment, the silicon film 2 is then under a high tensile stress.

It is then possible, if necessary, to provide a heat treatment of the type mentioned above in order to modify the lattice parameter of the porous silicon so as to reduce or eliminate the strain in the silicon layer 2, or even induce a compressive strain therein (FIG. 1f).

To modify the strained state of the porous silicon, hydrogen at the surface of the silicon may also be replaced with another species, for example methyl groups, using molecular grafting methods.

Figure 2D:
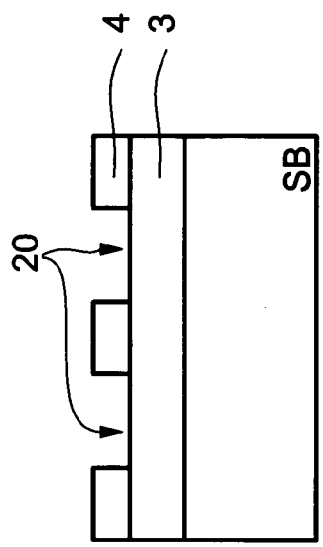
FIGS. 2a to 2f diagrammatically illustrate the main steps of a second method of implementing the invention.
Figure 2E:
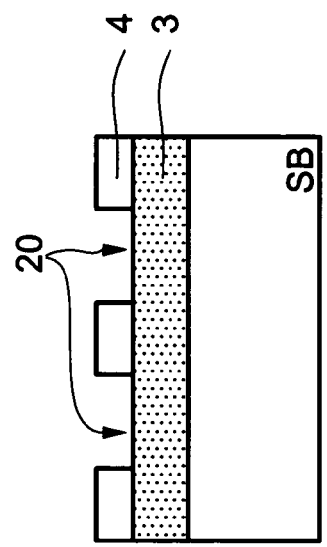
Figure 2F:
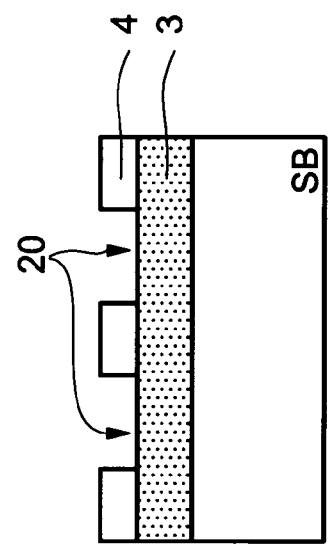
Figure 2A:
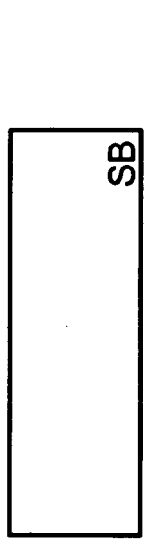
Figure 2B:
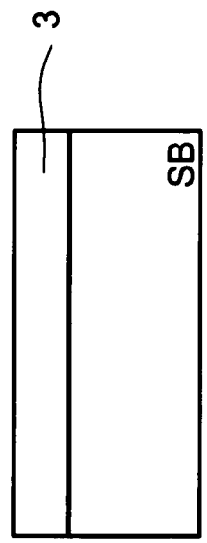
Figure 2C:
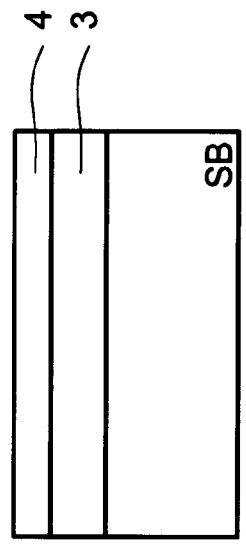

According to one method of implementing the invention, illustrated in FIGS. 2a to 2f, the order of the steps may be modified. A silicon layer 3 is formed on a base substrate SB and then doped (FIG. 2b). The dopant concentration is, for example, greater than 1017/cm3. A layer 4 of silicon or of a silicon/germanium alloy is formed by an epitaxial operation known per se (FIG. 2c). The latter layer 4 is selectively and locally etched (FIG. 2d) so as to gain access to the silicon layer 3. The silicon of the layer 3 is transformed to porous silicon and the strain is then generated during this step (FIG. 2e). A heat treatment may then be applied (FIG. 2f).

In one or other of the variants described, the structure obtained after heat treatment may, if necessary, be stabilized by a stabilization treatment. This stabilization may be obtained by various methods. One of them consists of a low-temperature (<450° C.) oxidation step that results in an oxide layer covering the internal surface of the structure. The stabilization may also be obtained by covering or filling the pores with another material, as described for example in French Patent Application No. 94/02197.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating a strained layer of silicon or of a silicon/germanium alloy, comprising:
    a) formation on a base substrate of an initial silicon layer;
    b) doping of the initial silicon layer;
    c) formation by epitaxy of the layer of silicon or of a silicon/germanium alloy on the initial doped silicon layer;
    d) etching of the silicon or silicon/germanium layer so as to gain access to the initial doped silicon layer; and
    e) transformation of the initial doped silicon layer into porous silicon thus modifying the lattice parameter of the initial doped silicon layer.

2. A process for fabricating a strained layer of silicon or of a silicon/germanium alloy, comprising:
    a) formation of a layer of silicon or of a silicon/germanium alloy on another layer of another material having a modifiable lattice parameter, wherein the other material having a modifiable lattice parameter is porous silicon; and
    b) modification of the lattice parameter of the other material, after formation of the layer of silicon or of a silicon/germanium alloy, wherein step a) comprises:
        formation on a base substrate of the layer of porous silicon,
        formation by epitaxy of the layer of silicon or of a silicon/germanium alloy on the layer of the porous silicon, and
        localized etching of the layer of silicon or of a silicon/germanium alloy so as to gain access to the layer of the porous silicon.

3. The process according to claim 2, wherein the modification of the lattice parameter of the other material having a modifiable lattice parameter in step b) comprises immersing the material in a hydrofluoric acid solution.

4. The process according to claim 2, wherein the modification of the lattice parameter of the other material having a modifiable lattice parameter in step b) comprises applying a heat treatment.

5. The process according to claim 2, wherein the modification of the lattice parameter of the other material having a modifiable lattice parameter in step b) comprises replacing hydrogen atoms in the layer of material having a modifiable lattice parameter with another species, preferably methyl groups.

6. The process according to claim 2, wherein the modification of the lattice parameter of the other material having a modifiable lattice parameter makes the material pass from a compression state to a tensile state.

7. A process for fabricating a strained layer of silicon or of a silicon/germanium alloy, comprising:
    a) formation of a layer of silicon or of a silicon/germanium alloy on another layer of another material having a modifiable lattice parameter, wherein the other material having a modifiable lattice parameter is porous silicon; and
    b) modification of the lattice parameter of the other material, after formation of the layer of silicon or of a silicon/germanium alloy, wherein step a) comprises:

formation on a base substrate of an initial silicon layer of the other material having a modifiable lattice parameter, doping of the initial silicon layer, formation by epitaxy of the layer of silicon or of a silicon/germanium alloy on the initial doped silicon layer, etching of the silicon or silicon/germanium layer so as to gain access to the initial doped silicon layer, and transformation of the initial doped silicon layer into porous silicon.

8. A process for fabricating a strained layer of silicon or of a silicon/germanium alloy, comprising:

formation of a layer of silicon or of a silicon/germanium alloy on a layer of a material having a modifiable lattice parameter, wherein the material having a modifiable lattice parameter comprises porous silicon; and modification of the lattice parameter by at least one of:
immersing the material in a hydrofluoric acid solution,
applying a heat treatment to the material, and
replacing hydrogen atoms in the layer of material having a modifiable lattice parameter with another species, preferably methyl groups.

* * * * *